United States Patent
Huang et al.

(10) Patent No.: US 9,312,126 B2
(45) Date of Patent: Apr. 12, 2016

(54) METHOD FOR PROCESSING GATE DIELECTRIC LAYER DEPOSITED ON GERMANIUM-BASED OR GROUP III-V COMPOUND-BASED SUBSTRATE

(71) Applicant: Peking University, Beijing (CN)

(72) Inventors: Ru Huang, Beijing (CN); Meng Lin, Beijing (CN); Xia An, Beijing (CN); Ming Li, Beijing (CN); Quanxin Yun, Beijing (CN); Zhiqiang Li, Beijing (CN); Min Li, Beijing (CN); Pengqiang Liu, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/415,555

(22) PCT Filed: Jan. 8, 2014

(86) PCT No.: PCT/CN2014/070302
§ 371 (c)(1),
(2) Date: Jan. 16, 2015

(87) PCT Pub. No.: WO2014/190771
PCT Pub. Date: Dec. 4, 2014

(65) Prior Publication Data
US 2015/0179439 A1    Jun. 25, 2015

(30) Foreign Application Priority Data

May 30, 2013    (CN) .......................... 2013 1 0208388

(51) Int. Cl.
*H01L 21/02*    (2006.01)
*H01L 21/28*    (2006.01)
*H01L 21/324*   (2006.01)

(52) U.S. Cl.
CPC ...... *H01L 21/02321* (2013.01); *H01L 21/0206* (2013.01); *H01L 21/0234* (2013.01); *H01L 21/28255* (2013.01); *H01L 21/28264* (2013.01); *H01L 21/324* (2013.01); *H01L 21/3245* (2013.01)

(58) Field of Classification Search
None
See application file for complete search history.

(56) References Cited

U.S. PATENT DOCUMENTS

2007/0190711 A1* 8/2007 Luo et al. ...................... 438/197
2014/0306215 A1* 10/2014 Baker et al. .................... 257/43

* cited by examiner

*Primary Examiner* — Scott B Geyer
(74) *Attorney, Agent, or Firm* — Thorpe North & Western, LLP

(57) ABSTRACT

The present invention discloses a method for processing a gate dielectric layer deposited on a germanium-based or Group III-V compound-based substrate, belonging to a semiconductor device field. The method comprises the steps of depositing a high-K gate dielectric layer on the germanium-based or Group III-V compound-based substrate, and then performing a plasma process to the high-K gate dielectric layer by using fluorine plasma, wherein during the plasma process, a guiding electric field is applied so that fluorine ions, when being accelerated to a surface of the gate dielectric layer, has an energy of 5-50 eV and the fluorine plasma drifts into the high-K gate dielectric layer, a ratio of a density of the fluorine ions in the high-K gate dielectric layer and a density of oxygen atoms in the high-K gate dielectric layer being 0.01-0.15:1.

16 Claims, 1 Drawing Sheet

METHOD FOR PROCESSING GATE DIELECTRIC LAYER DEPOSITED ON GERMANIUM-BASED OR GROUP III-V COMPOUND-BASED SUBSTRATE

CROSS REFERENCE OF RELATED APPLICATIONS

This application is a 371 U.S. Nationalization of Patent Cooperation Treaty Application PCT/CN2014/070302, filed Jan. 8, 2014 which claims the benefit of Chinese Patent Application No. 201310208388.X, filed on May 30, 2013, each of which are incorporated herein by reference in their entirety.

FIELD OF THE INVENTION

The present invention refers to a semiconductor device, and particularly refers to a method for processing a gate dielectric layer deposited on a germanium-based or Group III-V compound-based substrate.

BACKGROUND OF THE INVENTION

As the geometry size of the silicon-based metal-oxide-semiconductor field effect transistor (MOSFET) shrinks to a nanometer level, traditional methods to improve performance and integration degree by reducing the size of the transistor is facing dual limitation tests both in physical and technical aspects. In order to further improve the performance of the transistor, one of the effective methods is to introduce a channel material of high mobility.

Germanium and Group III-V compound semiconductors are considered to be preferred materials for the next generation of high-speed CMOS circuits because of the high mobility of holes and electrons. However, the current technologies for fabricating the germanium-based and Group III-V compound-based MOS devices are not yet matured. If a high-K gate dielectric layer is deposited on a substrate directly, defects such as high interface state density and poor interface quality may be existed at the interface, affecting the performance of the germanium-based and Group III-V compound-based MOS devices.

SUMMARY OF THE INVENTION

In order to improve the performance of the germanium-based and Group III-V compound-based MOS device, the present invention provides a method for processing a gate dielectric layer deposited on a germanium-based or Group III-V compound-based substrate.

The technical solutions of the present invention are as follows.

A method for processing a gate dielectric layer deposited on a germanium-based or Group III-V compound-based substrate comprises the steps of: depositing a high-K gate dielectric layer on the germanium-based or Group III-V compound-based substrate, and then performing a plasma process to the high-K gate dielectric layer by using fluorine plasma, wherein during the plasma process, a guiding electric field is applied so that fluorine ions, when being accelerated to a surface of the gate dielectric layer, has an energy of 5-50 eV and the fluorine plasma drifts into the gate dielectric layer, wherein a ratio of a density of the fluorine ions in the high-K gate dielectric layer and a density of oxygen atoms in the high-K gate dielectric layer is 0.01-0.15:1.

The method as described above further comprises the step of cleaning a surface of the germanium-based or Group III-V compound-based substrate to remove surface contaminations and native oxide, before the depositing of the gate dielectric layer.

The method as described above further comprises the step of performing a surface passivation process to the germanium-based or Group III-V compound-based substrate before the depositing of the gate dielectric layer, and the surface passivation process comprises depositing a passivation layer of Si, $SiO_2$, $Al_2O_3$, $AlN_x$, $GeN_x$, $GeO_2$, $Y_2O_3$, $La_2O_3$ or $CeO_2$ and so forth, or performing monolayer surface passivation utilizing S, N or P.

According to the method, the deposited gate dielectric layer may be formed of, but not limited to, HfO2, Al2O3, ZrO2, TiO2, TaO2, Y2O3, La2O3, GeO2 or GeNx.

According to the method, $CF_4$, $CHF_3$, $CH_2F_2$, $CH_3F$ may be used for producing the fluorine plasma, but not limited thereto. One of $CF_4$, $CHF_3$, $CH_2F_2$, $CH_3F$ or a combination of two or more thereof may be used as the reaction gas, with a flow of 20-100 sccm; inert gas Ar, He may be added into the reaction gas, with a flow of 0-100 sccm; $O_2$ may be added into the reaction gas in order to remove contaminations caused by carbon introduction, and a ratio of flows of the added $O_2$ and the fluorine-contained gas (such as $CF_4$) is 1:20-1:5.

According to the method, the fluorine plasma may be produced by using an inductively coupled plasma (ICP) equipment or any other equipments suitable for producing plasma.

According to the method, during the plasma process, an air pressure is 10-200 mTorr, a power for producing the plasma is 15-60 W, and a time for the plasma process is 30 s-60 min.

According to the method, the guiding electric field applied during the plasma process may be generated by using conventional plasma processing equipments. For example, the guiding electric field may be generated by RIE (reactive ion etching) power integrated in a plasma chamber equipment (such as an ICP etching system).

The method further comprises the step of performing an annealing process after the plasma process, with an annealing temperature of 350-550° C. and an annealing time of 30 s-5 min. The subsequent processes are then performed to fabricate MOS capacitors or devices.

The germanium-based substrate according to the present invention may be a bulk Ge substrate, a GOI substrate or any substrates on which an Ge epitaxial layer is contained, or may be a germanium-contained compound semiconductor substrate, such as SiGe, GeSn and so on. The Group III-V compound-based substrate according to the present invention may be GaAs, InP, GaSb, InGaAs, or other Group III-V compound substrates.

The advantages of the present invention are as follows. According to the present invention, the gate dielectric layer is performed the fluorine plasma passivation process, so that the defects at the interface between the substrate and the gate dielectric layer and the defects within the gate dielectric layer are passivated. If the gate dielectric layer is processed by using the fluorine plasma directly, the fluorine plasma is produced at the plasma source and transported to the gate dielectric layer and the interface thereof by diffusion, and plasma activity failure and low transport efficiency would occur, due to collisions during diffusion. According to the present invention, the guiding electric field is further applied during the process to guide the fluorine plasma to drift toward the gate dielectric, so that a ratio of the density of fluorine ions in the high-K dielectric and the density of oxygen atoms in the high-K dielectric layer is 0.01-0.15:1, and thereby the quality of the gate dielectric layer and efficiency for passivating the defects are enhanced, the interface state density is reduced and the interface quality is improved.

1—a semiconductor germanium substrate; 2—$HfO_2$

DETAILED DESCRIPTION OF THE EMBODIMENTS

The method according to the present invention will be further described below by a specific embodiment in connection with the accompanying drawings and by an example of a bulk germanium substrate.

Figure 1A:
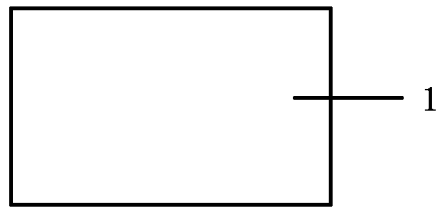
FIG. 1(a) to FIG. 1(c) are schematic views showing a surface passivation method according to an embodiment.

Step 1. As shown in FIG. 1(a), the germanium substrate is cleaned to remove oxide layers on a surface of the germanium substrate.

Figure 1B:
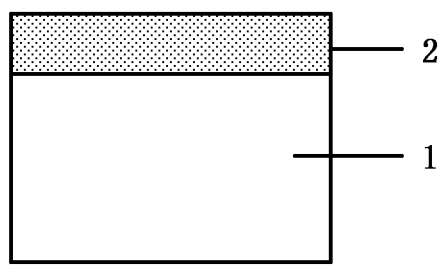

Step 2. As shown in FIG. 1(b), a gate dielectric layer is deposited on the germanium substrate. The gate dielectric layer may be formed of HfO2, Al2O3, ZrO2, TiO2, TaO2, Y2O3, La2O3, GeO2, GeNx and so forth. The gate dielectric layer may be deposited by a method such as sputtering, CVD, ALD, PLD, MBE and so forth. According to the embodiment, the gate dielectric layer is formed of HfO2, preferably, a thickness of which ranges between 2 nm and 20 nm, such as 5 nm.

Figure 1C:
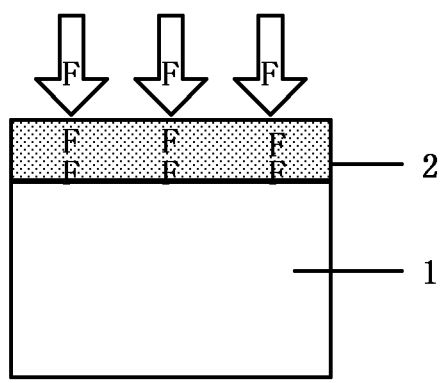

Step 3. As shown in FIG. 1(c), the germanium substrate on which $HfO_2$ is deposited is placed in a plasma chamber, in which plasma are produced by using a reaction gas so that a plasma process is performed. During the plasma process, a guiding electric field is applied to guide the plasma to drift toward the gate dielectric, so that ions have an energy of 5-50 eV when being accelerated to a surface of the gate dielectric layer. The reaction gas for producing fluorine plasma may be $CF_4$, $CHF_3$, $CH_2F_2$, $CH_3F$. But, it is not limited to these fluorine-contained gases. The reaction gas may be one of the above gases, or a combination of two or more of the above gases. A flow of the fluorine-contained gas is 20-100 sccm. An inert gas such as Ar, He and so forth, may be added into the fluorine-contained gas, with a flow of 0-100 sccm. To prevent contaminations caused by carbon, $O_2$ may be added into the reaction gas. A ratio of the added $O_2$ and the fluorine-contained gas (such as $CF_4$) is 1:20-1:5. According to the embodiment, a mixed gas of $CF_4$ and $O_2$ is used, preferably. Flows of $CF_4$ and $O_2$ are 50 sccm and 5 sccm, respectively. The fluorine plasma may be produced by an inductively coupled plasma (ICP) equipment or any other equipments suitable for producing plasma. According to the embodiment, the inductively coupled plasma (ICP) equipment is used, preferably. The pressure during the plasma process is 10-200 mTorr. According to the embodiment, 100 mTorr is used, preferably. A power used during the plasma process is 15-60 W. According to the embodiment, an ICP power of 20 W is applied. According to the embodiment, RIE power in an ICP etching system is used to generate the guiding electric field. The applied RIE power is 10 W. A time for the plasma process is 30 s-60 min, such as 3 min.

For $HfO_2$, a desired density of oxygen atoms is $5.55 \times 10^{22}$ $cm^{-3}$, and a density of the fluorine ions incorporated into $HfO_2$ is $5.55 \times 10^{20}$–$8.3 \times 10^{21}$ $cm^{-3}$. For the dielectric layer of $Al_2O_3$, a desired density of oxygen atoms is $7.02 \times 10^{22}$ $cm^{-3}$, and a density of the fluorine ions incorporated into $Al_2O_3$ is $7.0 \times 10^{20}$–$1.0 \times 10^{22}$ $cm^{-3}$.

Step 4. The substrate subjected to the plasma process is performed an annealing process. A temperature and time for the annealing process are 350° C.-550° C., 30 s-5 min, respectively. According to the embodiment, 550° C. and 60 s are used, preferably.

The present invention is described above in detail by the specific embodiment. Those skilled in the art should be understood that the above descriptions are only a particular embodiment of the present invention, and other materials may be used to achieve the passivation effect of the present invention without departing from the substantial scope of the present invention. Also, the same method may be used in other semiconductor substrates other than the germanium substrate according to the embodiment to achieve the same effect. The preparation methods are also not limited to the contents disclosed in the embodiment. Any equivalent changes and modifications made according to the claims of the present invention are all covered by the scope of the present invention.

What is claimed is:

1. A method for processing a gate dielectric layer deposited on a germanium-based or Group III-V compound-based substrate, comprising the steps of:

depositing a high-K gate dielectric layer on the germanium-based or Group III-V compound-based substrate: and performing a plasma process to the high-K gate dielectric layer using fluorine plasma, wherein during the plasma process, a guiding electric field is applied so that fluorine ions, when being accelerated to a surface of the gate dielectric layer, have an energy of from about 5 to about 50 eV and the fluorine plasma drifts into the high-K gate dielectric layer, wherein a ratio of a density of the fluorine ions in the high-K gate dielectric layer and a density of oxygen atoms in the high-K gate dielectric layer is from about 0.01 to about 0.15:1.

2. The method according to claim 1, further comprising the step of cleaning a surface of the germanium-based or Group III-V compound-based substrate to remove surface contaminations and native oxide layers, before depositing the high-K gate dielectric layer.

3. The method of claim 2, further comprising adding O2 to the fluorine containing gas at a flow ratio of 02 to fluorine-containing of about 1:20 to about 1:5.

4. The method of claim 1, further comprising the step of performing a surface passivation process to the germanium-based or Group III-V compound-based substrate before the depositing of the high-K gate dielectric layer.

5. The method of claim 4, wherein the surface passivation process comprises depositing a passivation layer comprising Si, SiO2, Al2O3, ANx, GeNx, GeO2, Y2O3, La2O3 or CeO2.

6. The method of claim 4, wherein the surface passivation process is a monolayer surface passivation utilizing S, N or P.

7. The method of claim 1, wherein the high-K gate dielectric layer comprises HfO2, Al2O3, ZrO2, TiO2, TaO2, Y2O3, La2O3, GeO2 or GeNx.

8. The method of claim 1, wherein the plasma process utilizes a fluorine-containing gas for producing the fluorine plasma.

9. The method of claim 1, wherein the fluorine-containing gas is CF4, CHF3, CH2F2, CH3F or a combination thereof.

10. The method of claim 9, wherein the fluorine containing gas has a flow of from about 20 to about 100 sccm.

11. The method of claim 9, further comprising adding an inert gas to the fluorine containing gas.

12. The method of claim 11, wherein the inert gas is Ar, He, or a combination thereof.

13. The method of claim 11, wherein the inert gas has a flow of from about 0 to about 100 sccm.

14. The method of claim 1, wherein the fluorine plasma is produced by using inductively coupled plasma ICP equipment, and during the plasma process using the fluorine plasma, a pressure is 10-200 mTorr, a power for producing the plasma is 15-60 W, and a time for the plasma process is 30 s-60 min.

15. The method of claim 1, wherein the guiding electric field applied in the plasma process using the fluorine plasma is generated using RIE power integrated in an ICP etching system.

16. The method of claim 1, further comprising the step of performing an annealing process with an annealing temperature of from about 350 to about 550° C. and an annealing time of about 30 s to about 5 min.

* * * * *